United States Patent
Huang et al.

(10) Patent No.: US 7,221,052 B2
(45) Date of Patent: May 22, 2007

(54) CHIP SCALE PACKAGE WITH MICRO ANTENNA AND METHOD FOR MANUFACTURING THE SAME

(75) Inventors: Min-Lung Huang, Kao-Hsiung (TW); Tsung-Hua Wu, Kao-Hsiung Hsien (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 0 days.

(21) Appl. No.: 11/163,133

(22) Filed: Oct. 6, 2005

(65) Prior Publication Data

US 2006/0081982 A1    Apr. 20, 2006

(30) Foreign Application Priority Data

Oct. 19, 2004    (TW)    .............................. 93131688 A

(51) Int. Cl.
*H01L 23/48*    (2006.01)
(52) U.S. Cl. ................ 257/734; 257/679; 257/E33.066
(58) Field of Classification Search ................ 257/679, 257/734, E33.066
See application file for complete search history.

(56) References Cited

U.S. PATENT DOCUMENTS

| | | | |
|---|---|---|---|
| 6,121,683 A * | 9/2000 | Yamazaki et al. | 257/734 |
| 6,580,107 B2 * | 6/2003 | Asano et al. | 257/282 |
| 6,768,190 B2 | 7/2004 | Yang et al. | |
| 6,927,964 B2 | 8/2005 | Tong et al. | |
| 7,056,810 B2 * | 6/2006 | Yamazaki et al. | 438/458 |
| 2001/0028103 A1 * | 10/2001 | Usami | 257/679 |
| 2004/0238952 A1 * | 12/2004 | Farnworth et al. | 257/734 |

FOREIGN PATENT DOCUMENTS

TW    506138    10/2002

* cited by examiner

*Primary Examiner*—Michelle Estrada
(74) *Attorney, Agent, or Firm*—Winston Hsu

(57) ABSTRACT

A chip scale package with micro antenna includes a chip, a first dielectric layer and an antenna. The chip has an active surface, a first bonding pad and a second bonding pad on the active surface. The first dielectric layer is formed on the active surface of the chip. The first dielectric layer has a plurality of openings to expose the first bonding pad and the second bonding pad. Each of the openings has an expanding inclined sidewall. The antenna is formed on the upper surface of the first dielectric layer and connected to the first bonding pad and the second bonding pad through the inclined sidewall of the openings for preventing antenna cracking.

8 Claims, 9 Drawing Sheets

US 7,221,052 B2

CHIP SCALE PACKAGE WITH MICRO ANTENNA AND METHOD FOR MANUFACTURING THE SAME

BACKGROUND OF THE INVENTION

1. Field of the Invention

The invention relates to a chip scale package, and more particularly, to a chip scale package with a micro antenna and method for manufacturing the same.

2. Description of the Prior Art

The operation of conventional radio frequency devices of non-contact type IC cards commonly involves disposing a radio frequency identification (RFID) chip and an antenna coil on a card and utilizing a conductive post or a plurality of bonding wires to connect the antenna coil and the RFID chip, in which the antenna coil while being sensed will access the information contained in the RFID chip. In order to minimize the size of the radio frequency devices and increase the efficiency of the antenna coil, another method of fabricating radio frequency devices involves minimizing the antenna by forming the antenna directly on the active surface of a chip, in which the active surface of the chip includes a dielectric layer. Preferably, the antenna is formed on the dielectric layer and connected to the bonding pads of the chip. Due to the fact that an increase in thickness of the dielectric layer will increase the sensitivity of the antenna, a height different will often result between the antenna and the bonding pads and ultimately cause the contact portion between the antenna and the dielectric layer and the bonding pads to crack.

Taiwan Patent No. 506138 discloses a semiconductor device having an antenna. Please refer to FIG. 1. FIG. 1 is a cross section diagram of a semiconductor device with antennae according to the prior art. As shown in FIG. 1, a semiconductor device 100 includes a semiconductor substrate 110, a plurality of dielectric layers 120, a passivation layer 130, a first insulating layer 140, a plurality of antennae 150, and a second insulating layer 160, in which the upper surface 111 of the semiconductor substrate 110 includes a gate 112 and a plurality of drains 113 to form a metal oxide semiconductor (MOS). Preferably, the dielectric layers 120 are formed over the upper surface 111 of the semiconductor substrate 110, in which each of the dielectric layers 120 includes a plurality of metal wires 121 thereon, a plurality of upper metal layers 131 disposed on the upper most layer of the dielectric layers 120 upper surface. Additionally, the passivation layer 130 is formed on the dielectric layer 120 to encapsulate the upper metal layers 131, the first insulating layer 140 is formed on the passivation layer 130 to block electromagnetic waves, the antennae 150 are disposed on the first insulating layer 140, and the second insulating layer 160 is formed on the first insulating layer 140 to encapsulate the antennae 150. The antennae are composed of non-straight metal wires and connected to an active device (not shown), in which the electrical connection between the antennae 150 and the electrodes are not shown in the semiconductor device 100.

SUMMARY OF THE INVENTION

It is therefore an objective of the present invention to provide a chip scale package with micro antenna, in which the chip scale package includes a chip, a first dielectric layer, and an antenna. The chip has an active surface, a first bonding pad, and a second bonding pad on the active surface. The first dielectric layer is formed on the active surface of the chip. The first dielectric layer has a plurality of openings to expose the first bonding pad and the second bonding pad. Each of the openings has an expanding inclined sidewall. The antenna is formed on the upper surface of the first dielectric layer and connected to the first bonding pad and the second bonding pad through the inclined sidewall of the openings for preventing antenna cracking.

According to the chip scale package with micro antenna of the present invention, the first dielectric layer of the chip scale package also includes a plurality of openings to expose the chip and the first bonding pad and the second bonding pad. Each of the openings includes an inclined sidewall, in which the angle included by the inclined sidewall and the chip is between 30° to 70°. An antenna is formed on the upper surface of the dielectric layer and smoothly connected to the bonding pads via the inclined sidewall.

According to the chip scale package with micro antenna of the present invention, the thickness of the first dielectric layer is between 10 μm to 30 μm to facilitate the sensitivity of the antenna. Additionally, the joint between the upper surface of the first dielectric layer and the inclined sidewall of the openings includes a curved angle, and the antenna is extended from the curved angle to form an arc thereby preventing antenna cracking.

According to the chip scale package with micro antenna of the present invention, a second dielectric layer is formed on the first dielectric layer and filled within the openings of the first dielectric layer to encapsulate and protect the antenna.

Another aspect of the present invention is to provide a method of manufacturing a chip size package with micro antenna. The method includes the following steps: providing a chip having an active surface and a first bonding pad and a second bonding pad disposed on the active surface; forming a first dielectric layer on the active surface of the chip, wherein the first dielectric layer comprises an upper surface; forming a plurality of openings on the first dielectric layer to expose the first bonding pad and the second bonding pad, wherein each of the openings comprises an expanding inclined sidewall; disposing a metal layer on the upper surface of the first dielectric layer and covering the inclined sidewall, the first bonding pad, and the second bonding pad; and selectively etching the metal layer to form an antenna, wherein the antenna is disposed on the upper surface of the first dielectric layer and connected to the first bonding pad and the second bonding pad through the inclined sidewall.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
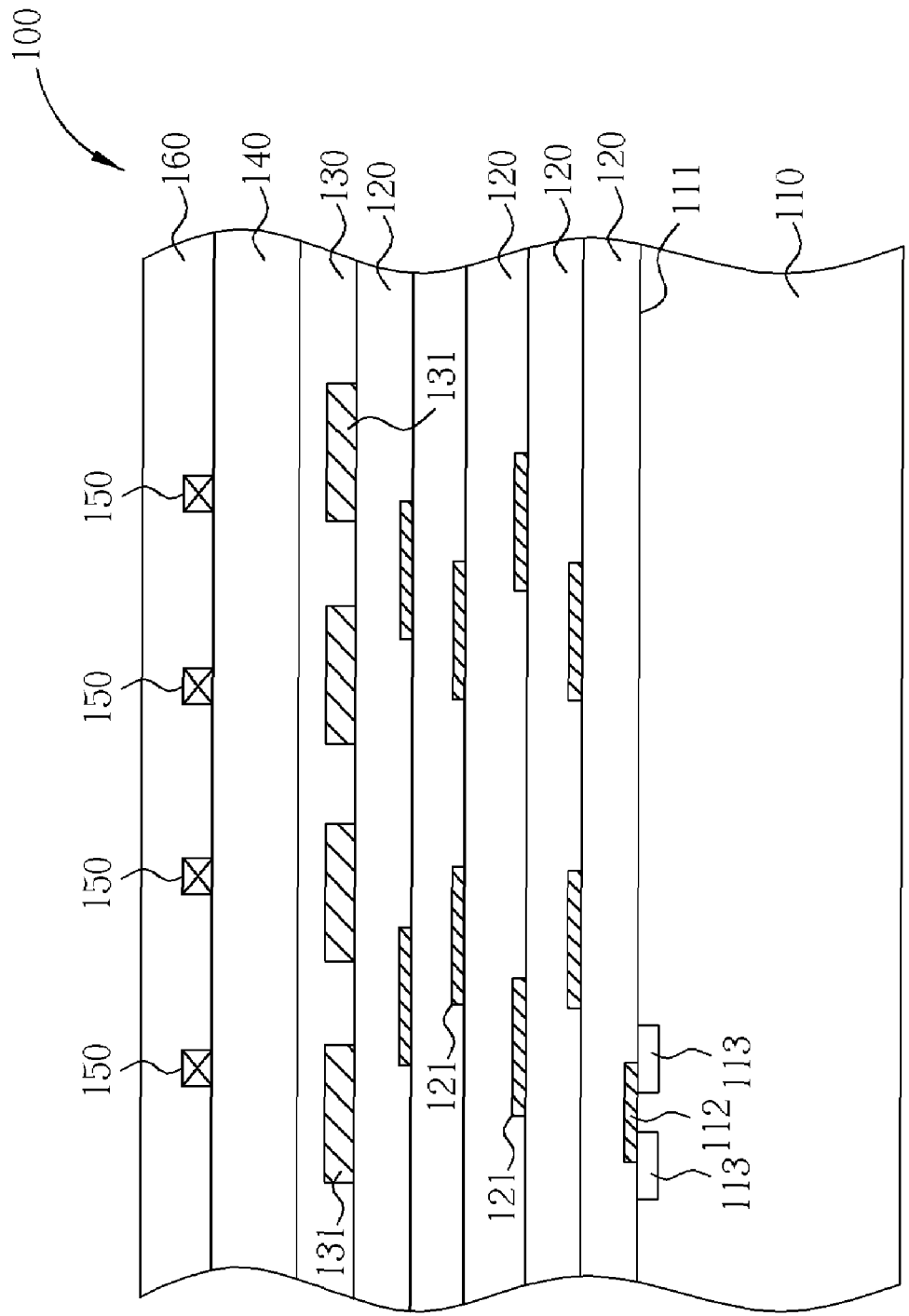
FIG. 1 is a cross section diagram showing a semiconductor device with antennae according to the prior art.
Figure 2:
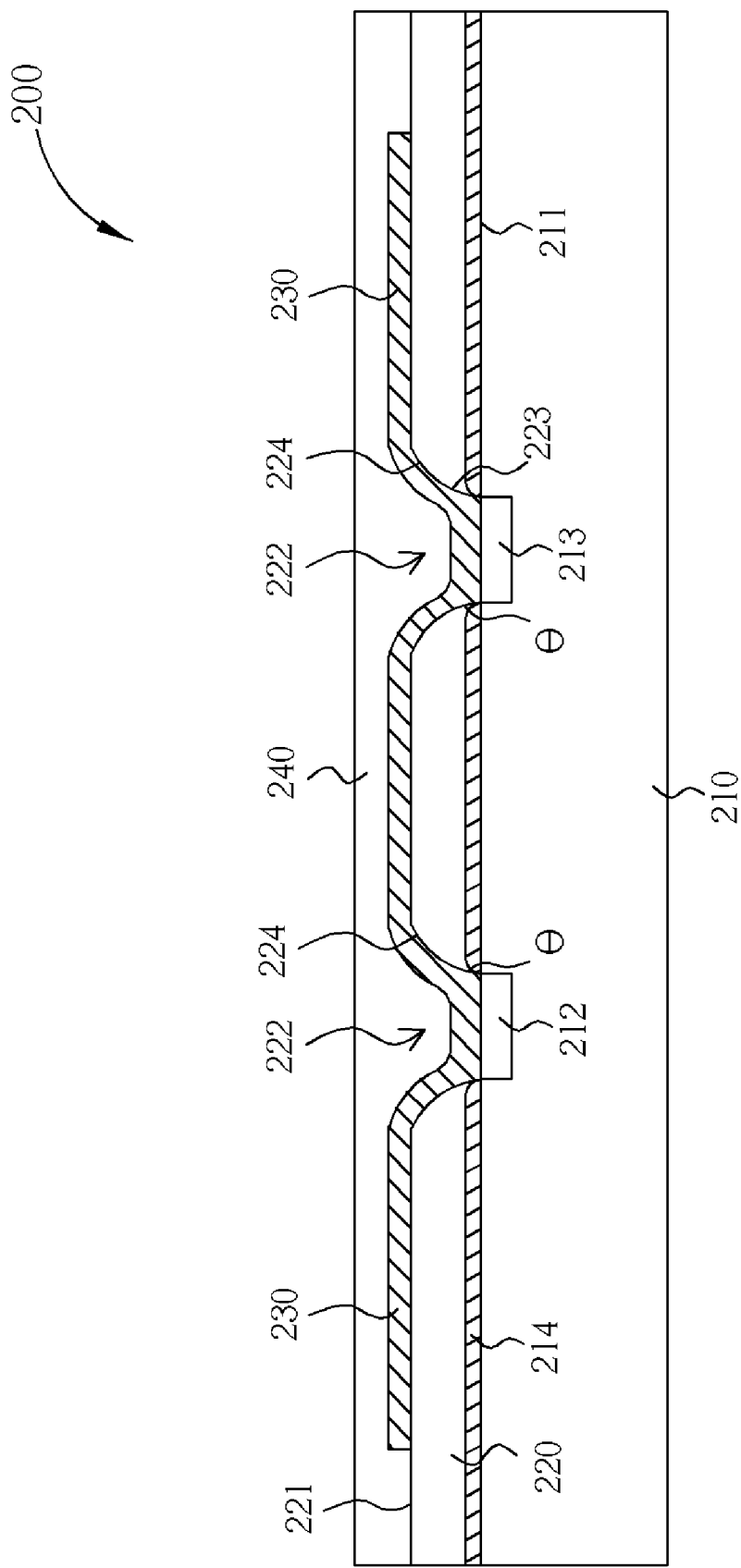
FIG. 2 is a cross section diagram showing a chip size package with micro antenna according to the present invention.
Figure 3:
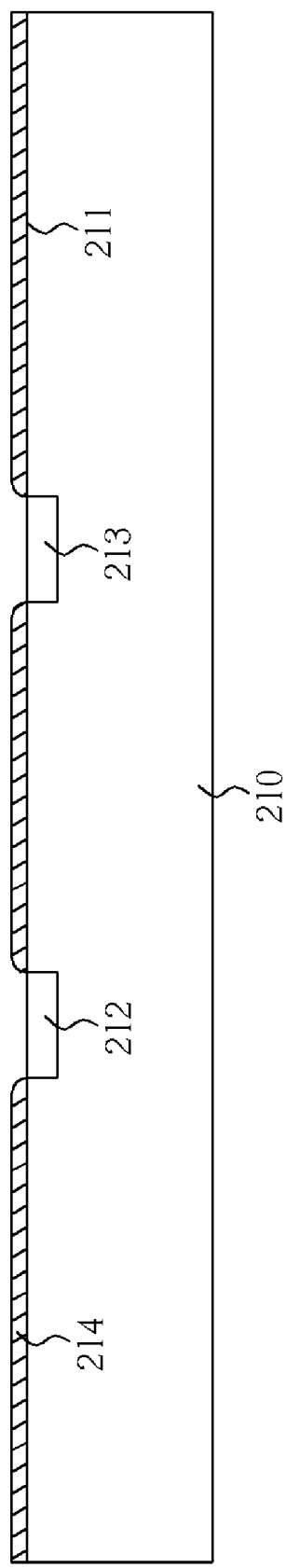
FIG. 3 through FIG. 9 are cross section diagrams showing the means of manufacturing a chip size package with micro antennae according to the present invention.

Please refer to FIG. 2. FIG. 2 is a cross-sectional diagram showing a chip size package 200 with micro antenna according to the present invention. As shown in FIG. 2, the chip size package 200 includes a chip 210, a first dielectric layer 220 and an antenna 230, in which the chip 210 includes an active surface 211, a first bonding pad 212, a second bonding pad 213, and a passivation layer 214 formed on the active surface 211. Preferably, the chip 210 is a radio frequency identification (RFID) chip.

Preferably, the first dielectric layer 220 is formed on the active surface 211 of the chip 210, in which the thickness of the first dielectric layer 220 is between 10 μm to 30 μm. The first dielectric layer 220 also includes an upper surface 221 and a plurality of openings 222 to expose the first bonding pad 212 and the second bonding pad 213, in which each of the openings 222 includes an expanding inclined sidewall 223. Additionally, angle θ included by the inclined sidewall 223 and the active surface 211 of the chip 210 is between 30° to 70°, the joint between the upper surface 221 of the first dielectric layer 220 and the inclined sidewall 223 includes a curved angle 224, and the first dielectric layer 220 is composed of photosensitive materials such as benzocyclobutene (BCB), polyimide, or photosensitive polyimide.

Preferably, the antenna 230 is formed on the upper surface 221 of the first dielectric layer 220, in which the antenna 230 is an antenna coil (not shown) and extended from the curved angle 224 to form an arc. Additionally, one end of the antenna 230 is connected to the first bonding pad 212 via the inclined sidewall 223 of the openings 222 and the other end of the antenna 230 is connected to the second bonding pad 213 via another inclined sidewall 223 to establish an electrical connection. According to the preferred embodiment of the present invention, a second dielectric layer 240 is formed on the first dielectric layer 220 and filled within the openings 222 to encapsulate the antenna 230, in which the second dielectric layer 240 can be composed of same or different material as the first dielectric layer 220.

Figure 4:
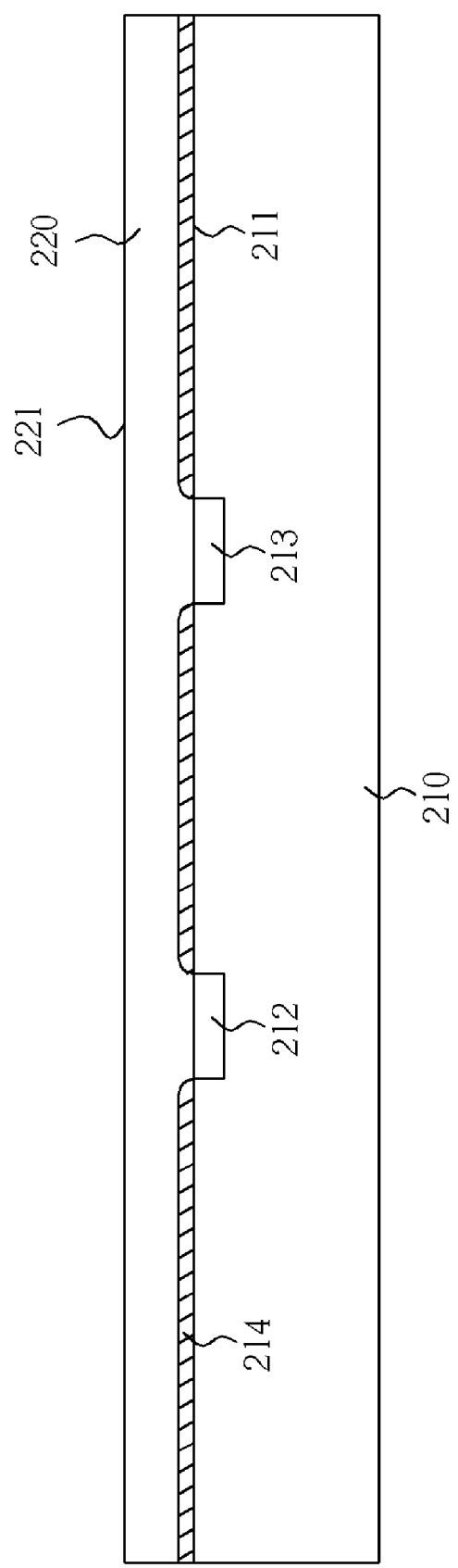
Figure 5:
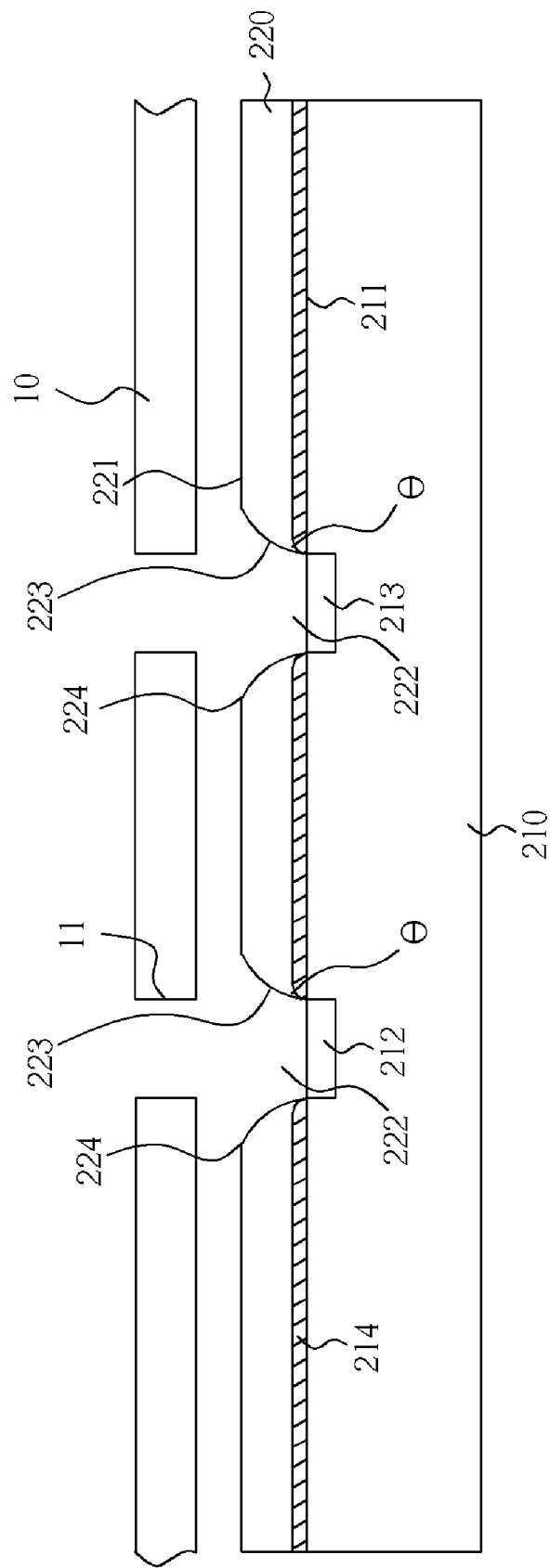
Figure 6:
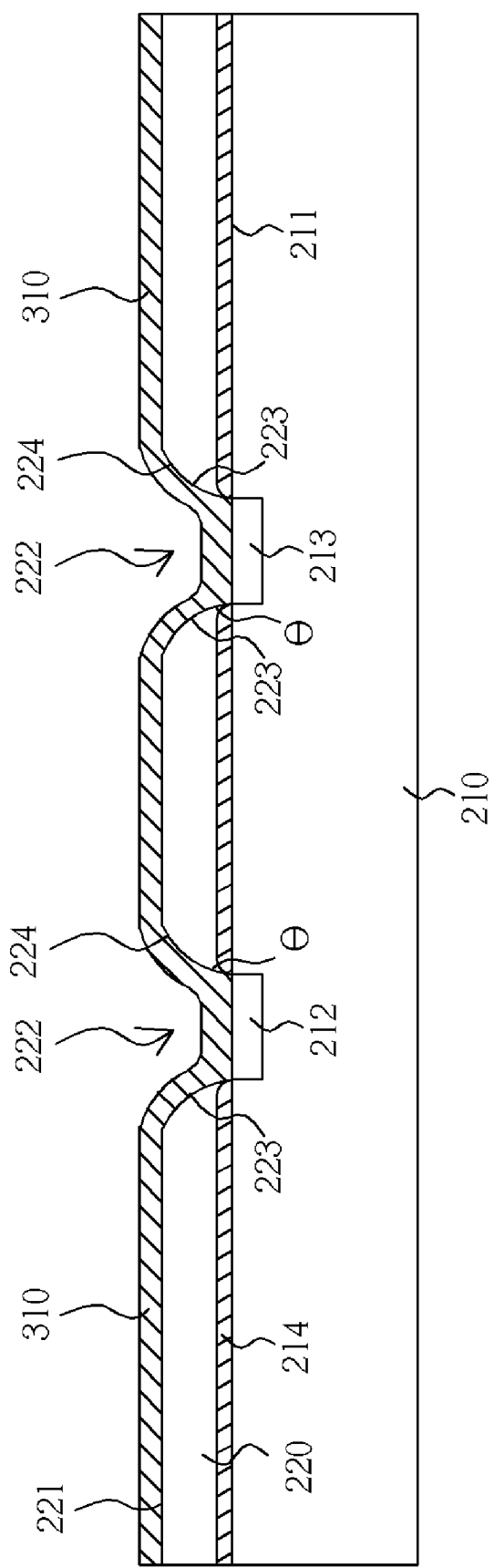

Please refer to FIG. 3 through FIG. 9. FIG. 3 through FIG. 9 are cross section diagrams showing the means of manufacturing a chip size package with micro antennae according to the present invention. As show in FIG. 3, a chip 210 is first provided, in which during the manufacturing process the chip 210 is fabricated from a wafer (not shown). Next, a first bonding pad 212, the second bonding pad 213, and the passivation layer 214 are formed on the active surface 211 of the chip 210. As shown in FIG. 4, a spin coating is performed to form the first dielectric layer 220 on the active surface 211 of the chip 210 and the passivation layer 214, in which the first dielectric layer 220 includes an upper surface 221. As shown in FIG. 5, a photomask 10 having a plurality of openings 11 is disposed on the chip 210, in which the distance between the photomask 10 and the chip 210 is between 30 μm and 300 μm. Subsequently, a proximity exposure is preformed on the first dielectric layer 220 by utilizing a light source to penetrate the openings 11 and expose the first dielectric layer 220, and development and curing process are performed to form the openings 222 to expose the first bonding pad 212 and the second bonding pad 213, in which each of the openings 222 includes the inclined sidewalls 223. Preferably, the angle θ included by the inclined sidewall 223 of the openings 222 and the active surface 211 of the chip 210 is between 30° to 70° and the joint between the upper surface 221 of the first dielectric layer 220 and the inclined sidewall 223 includes the curved angle 224. As shown in FIG. 6, a sputtering, physical vapor deposition (PVD), or chemical vapor deposition (CVD) process is performed to dispose a metal layer 310 on the upper surface 221 of the first dielectric layer 220 and covering the inclined sidewalls 223, the first bonding pad 212, and the second bonding pad 213.

Figure 7:
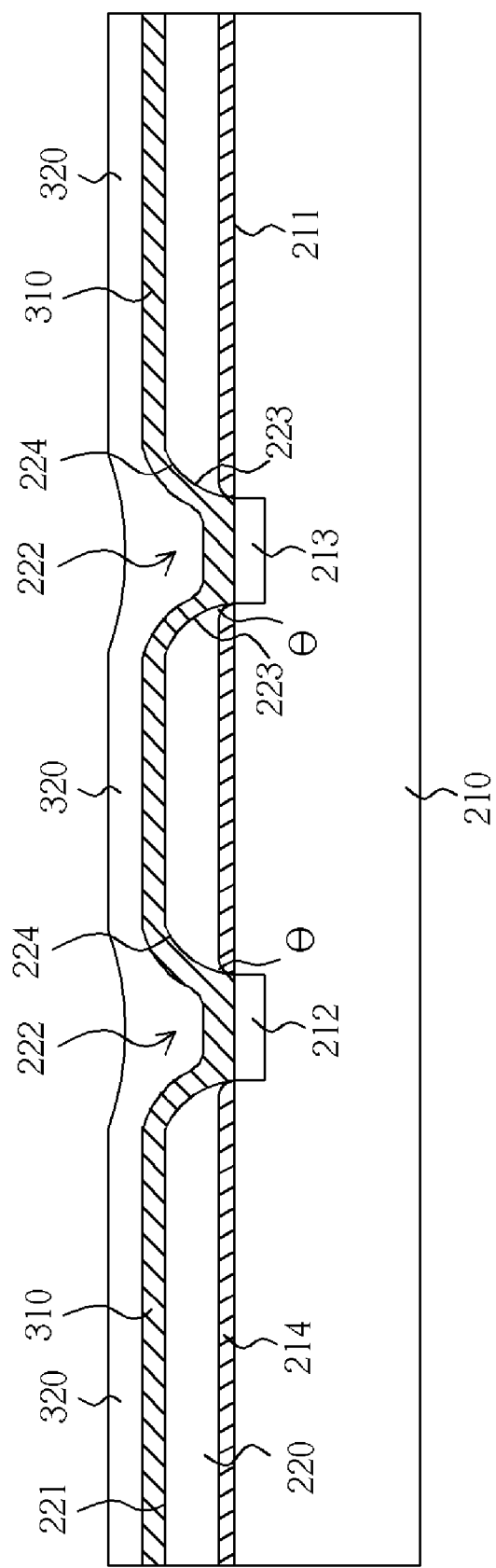
Figure 8:
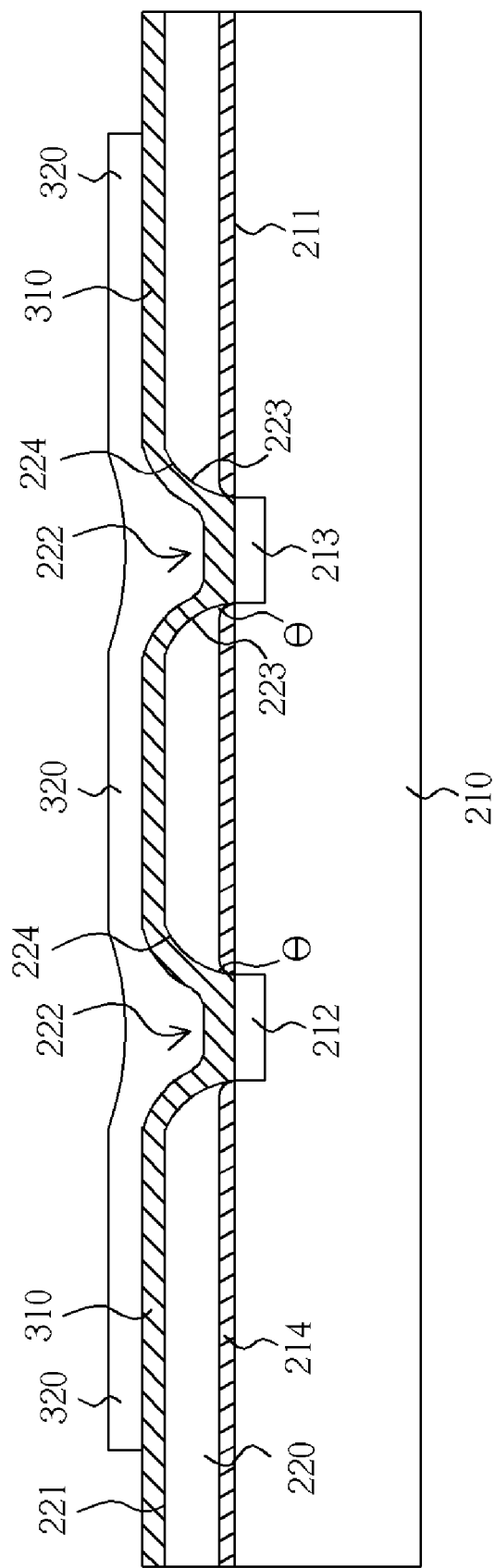
Figure 9:
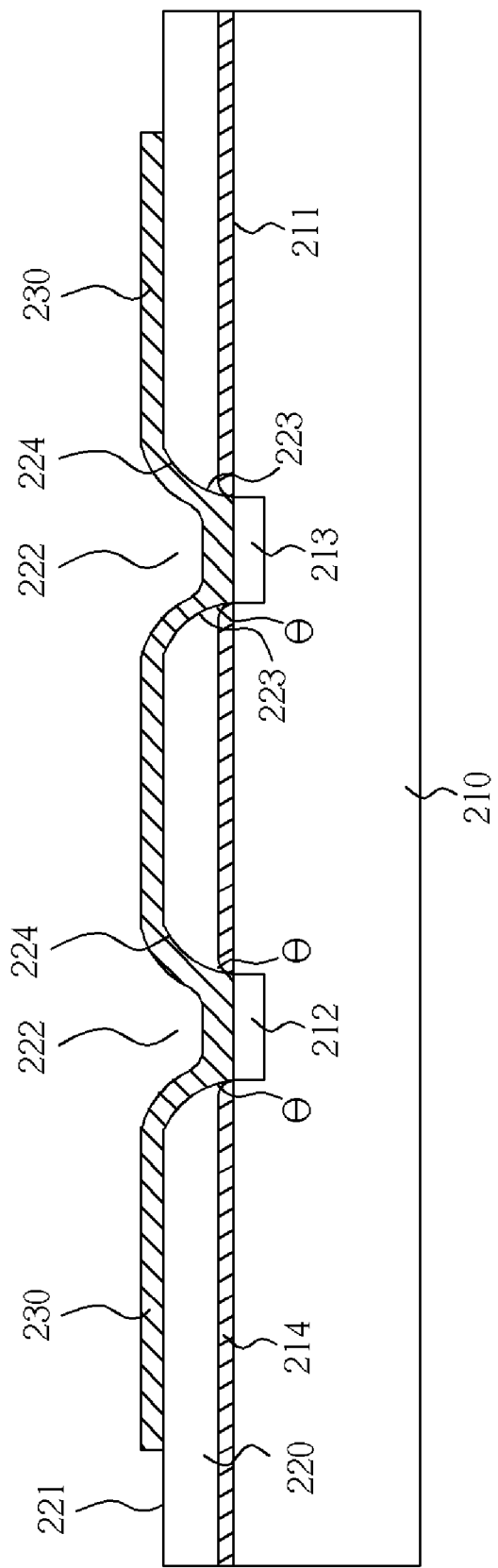

As shown in FIG. 7, a photoresist 320 is disposed on the metal layer 310 and filled within the openings 222, in which the thickness of the photoresist 320 is between 5 μm and 15 μm. As shown in FIG. 8, the photoresist 320 is patterned by performing an exposure and development process on the photoresist 320. As shown in FIG. 9, a selective etching process is performed on the metal layer 310 after removing the photoresist 320 to form the antenna 230, in which the antenna 230 is formed over the upper surface 221 of the first dielectric layer 220. Preferably, the antenna 230 is extended from the curved angle 224 to form an arc. Additionally, one end of the antenna 230 is connected to the first bonding pad 212 via the inclined sidewall 223 of the openings 222 and the other end of the antenna 230 is connected to the second bonding pad 213 via another inclined sidewall 223. As shown in FIG. 2, a spin coating is performed to form the second dielectric layer 240 on the first dielectric layer 220 and exposure and development processes are performed on the second dielectric layer 240 thereafter. According to the preferred embodiment of the present invention, the second dielectric layer 240 is filled within the openings 222 of the first dielectric layer 220 to encapsulate the antenna 230 and complete the chip size package 200 containing a micro antenna.

According to the chip size package 200 with micro antenna described above, the openings 222 of the first dielectric layer 220 are expanding openings, in which the angle θ included by the inclined sidewall 223 of the openings 222 and the active surface 211 of the chip 210 is between 30° to 70°. Additionally, the joint between the upper surface 221 of the first dielectric layer 220 and the inclined sidewall 223 includes the curved angle 224 and the antenna 230 is extended from the curved angle 224 to form an arc thereby preventing antenna cracking. Moreover, the thickness of the first dielectric layer 220 is between 10 μm to 30 μm to facilitate the sensitivity of the antenna 230 and the second dielectric layer 240 is utilized to encapsulate and protect the antenna 230 from any damages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip size package with micro antenna comprising:
   a chip having an active surface, and a first bonding pad and a second bonding pad disposed on the active surface;
   a first dielectric layer formed on the active surface of the chip, wherein the first dielectric layer comprises an upper surface and a plurality of openings to expose the first bonding pad and the second bonding pad, wherein each of the openings comprises an expanding inclined sidewall and the angle included by the inclined sidewall and the chip is between 30° to 70°; and
   an antenna formed on the upper surface of the first dielectric layer and connected to the first bonding pad and the second bonding pad through the inclined sidewall.

2. The chip size package with micro antenna of claim 1, wherein the thickness of the first dielectric layer is between 10 μm to 30 μm.

3. The chip size package with micro antenna of claim 1 further comprising a second dielectric layer formed on the first dielectric layer for encapsulating the antenna.

4. The chip size package with micro antenna of claim 3, wherein the second dielectric layer is filled within the openings.

5. The chip size package with micro antenna of claim 3, wherein the second dielectric layer and the first dielectric layer are comprised of same material.

6. The chip size package with micro antenna of claim 1, wherein the first dielectric layer is comprised of benzocyclobutene (BCB), polyimide, or photosensitive polyimide.

7. The chip size package with micro antenna of claim 1, wherein the joint between the upper surface of the first dielectric layer and the inclined sidewall comprises a curved angle.

8. The chip size package with micro antenna of claim 7, wherein the antenna extends from the curved angle to form an arc.

* * * * *